(12) United States Patent
Lee et al.

(10) Patent No.: US 8,947,277 B2
(45) Date of Patent: Feb. 3, 2015

(54) MULTI-CHANNEL SAMPLE-AND-HOLD CIRCUIT AND ANALOG-TO-DIGITAL CONVERTER USING THE SAME

(75) Inventors: Kyung Hoon Lee, Seoul (KR); Michael Choi, Seoul (KR); Eun Seok Shin, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 212 days.

(21) Appl. No.: 13/608,515

(22) Filed: Sep. 10, 2012

(65) Prior Publication Data
US 2013/0222335 A1 Aug. 29, 2013

(30) Foreign Application Priority Data

Feb. 27, 2012 (KR) .................. 10-2012-0019739

(51) Int. Cl.
*H03M 1/00* (2006.01)
(52) U.S. Cl.
USPC .................. 341/122; 341/163; 341/155
(58) Field of Classification Search
CPC ... G11C 27/026; G11C 27/024; G06F 3/0416
USPC .................. 341/122, 163, 155, 118
See application file for complete search history.

(56) References Cited

U.S. PATENT DOCUMENTS

| 4,306,143 | A | * | 12/1981 | Utagawa et al. | ........... 250/208.1 |
| 5,784,601 | A | * | 7/1998 | Kisaichi | ........................ 713/600 |
| 6,437,608 | B1 | * | 8/2002 | Miyabe et al. | .................. 327/96 |
| 7,319,419 | B1 | * | 1/2008 | Lash et al. | ..................... 341/118 |
| 7,330,146 | B2 | * | 2/2008 | Boemler | ....................... 341/163 |
| 7,626,524 | B2 | | 12/2009 | Horie | |
| 2002/0089491 | A1 | * | 7/2002 | Willig | ........................... 345/173 |
| 2007/0096773 | A1 | | 5/2007 | Takashima et al. | |
| 2007/0262966 | A1 | | 11/2007 | Nishimura et al. | |

* cited by examiner

*Primary Examiner* — Jean B Jeanglaude

(57) ABSTRACT

A sample-and-hold circuit including an operational amplifier configured to output a result signal to the ADC; a feedback capacitor connected between an input terminal and an output terminal of the operational amplifier to form a feedback path; a plurality of sampling capacitor blocks each connected to one of a plurality of channels and configured to sample and hold an analog signal input to each of the channels; a plurality of controllers each connected between one of the sampling capacitor blocks and the operational amplifier; and a reset unit connected between a reference voltage source and the input terminal of the operational amplifier to reset the operational amplifier when the operational amplifier does not perform a holding operation. The plurality of controllers configured to switch the sampled signal so that held signals for the respective channels are sequentially input to the operational amplifier.

20 Claims, 14 Drawing Sheets

US 8,947,277 B2

MULTI-CHANNEL SAMPLE-AND-HOLD CIRCUIT AND ANALOG-TO-DIGITAL CONVERTER USING THE SAME

CROSS-REFERENCE TO RELATED APPLICATIONS

This application claims priority under 35 U.S.C. §119(a) from Korean Patent Application No. 10-2012-0019739 filed on Feb. 27, 2012, the disclosure of which is hereby incorporated by reference in its entirety.

BACKGROUND

Embodiments of the inventive concepts relate to a sample-and-hold circuit that may be used with an analog-to-digital converter (ADC).

As the market of wireless portable system on chip (SoC) application products allowing people to enjoy listening to and watching data anywhere at any time has grown recently, the area and power consumption of circuits used in these portable SoC products are important design characteristics to the competitiveness of the products.

A touch screen controller that needs to process a plurality of channel input signals requires an ADC that converts a plurality of analog input signals into digital signals and transmits the digital signals to a digital signal processing block.

A sample-and-hold amplifier (SHA) is usually used at a front-end of the ADC to sample and process an input signal without distortion. In order to process a plurality of input signals at the ADC's front-end, as many SHAs as the number of input signals are generally needed. An SHA includes a switched capacitor and an amplifier, where the amplifier often requires the largest amount of area and power consumption of the SHA.

SUMMARY

According to some embodiments of the inventive concepts, there is provided a sample-and-hold circuit including an operational amplifier configured to output a result signal to an analog-to-digital converter; a feedback capacitor connected between an input terminal and an output terminal of the operational amplifier to form a feedback path; a plurality of sampling capacitor blocks, each sampling capacitor block connected to one of a plurality of channels, the plurality of sampling capacitor blocks configured to sample and hold an analog signal input to each of the channels; a plurality of controllers, each controller connected between one of the sampling capacitor blocks and the operational amplifier, the plurality of controllers configured to switch the sampled signal so that held signals for the respective channels are sequentially input to the operational amplifier; and a reset unit connected between a reference voltage source and the input terminal of the operational amplifier, the reset unit configured to reset the operational amplifier when the operational amplifier does not perform a holding operation.

Each of the sampling capacitor blocks may include a first sampling switch configured to apply the analog signal input to each of the channels in response to a first sampling control signal and a sampling capacitor configured to be charged with a voltage of the analog signal.

Each of the sampling capacitor blocks may further include a second sampling switch configured to electrically couple the sampling capacitor and the reference power source in response to a second sampling control signal.

The controller may include a hold switch configured to output the held signal to the operational amplifier in response to a hold control signal, which is sequentially applied to each of the plurality of channels.

The reset unit may be configured to reset the operational amplifier, if the operational amplifier samples the analog signal input to each of the channels and does not perform the holding operation.

The operational amplifier may include an input terminal connected to a first node. The controller may include a plurality of hold switches connected between a respective one the sampling capacitor blocks and the first node, the plurality of hold switches configured to sequentially output one of the signals held by electrically coupling the hold switches to the first node in response to the hold control signal sequentially applied to the plurality of channels.

Alternatively, the operational amplifier may include a plurality of input terminals respectively connected to a plurality of second nodes. The controller may include a hold switch connected between an output terminal of a respective one of the sampling capacitor blocks and a second node, the controller may output the signal held by electrically coupling the hold switch to the second node in response to the hold control signal sequentially applied to the plurality of channels.

The reset unit may be connected between the reference voltage source and the second node and may reset the output terminal of the operational amplifier and non-used input terminal of the operational amplifier, if the operational amplifier samples the analog signal input to each of the channels and does not perform the holding operation.

The operational amplifier may be a fully differential amplifier.

According to other embodiments of the inventive concepts, there is provided a sample-and-hold circuit including an operational amplifier configured to have M input terminals and one output terminal and to output a result signal to an analog-to-digital converter; a feedback capacitor connected between the input terminals and the output terminal of the operational amplifier to form a feedback path; N sampling capacitor blocks each connected to one of N channels, the N sampling capacitor blocks configured to sample analog signals input to the N channels; a controller connected between output terminals of at least two of the N sampling capacitor blocks and one of the input terminals of the operational amplifier, the controller configured to input each of the held signals to a respective one of the M input terminals of the operational amplifier; and M reset switches, each reset switch connected between a reference voltage source and the respective input terminals of the operational amplifier, the M reset switches configured to reset the output terminal of the operational amplifier if the operational amplifier does not perform a holding operation and to reset input terminals not used in the holding operation of the operational amplifier in response to a group reset control signal.

Each of the sampling capacitor blocks may include a first sampling switch configured to apply the analog signal input to each of the channels in response to a first sampling control signal and a sampling capacitor configured to be charged with a voltage of the analog signal.

Each of the sampling capacitor blocks may further include a second sampling switch configured to electrically couple an output terminal of the sampling capacitor and the reference voltage source.

The controller may include a plurality of hold switches each connected between a respective one of the sampling capacitor blocks and one of the M input terminals of the operational amplifier. The plurality of hold switches configured to sequentially output one of held signals held in response to the hold control signal sequentially applied to the plurality of channels.

The operational amplifier may be a fully differential amplifier.

According to another example embodiment, there is a sample-and-hold circuit including an operational amplifier, a plurality of sampling blocks and a plurality of switching units. The operational amplifier having an input terminal and an output terminal electrically coupled to form a feedback loop. The plurality of sampling blocks configured to simultaneously sample and hold respective analog signals input from respective channels. The plurality of switching units configured to sequentially couple a respective one of the plurality of sampling blocks to the operational amplifier to sequentially provide the operational amplifier with one of the analog signals held at the respective one of the plurality of sampling blocks.

BRIEF DESCRIPTION OF THE DRAWINGS

The above and other features and advantages of the inventive concepts will become more apparent by describing in detail example embodiments thereof with reference to the attached drawings in which.

DETAILED DESCRIPTION OF THE EMBODIMENTS

Figure 1:
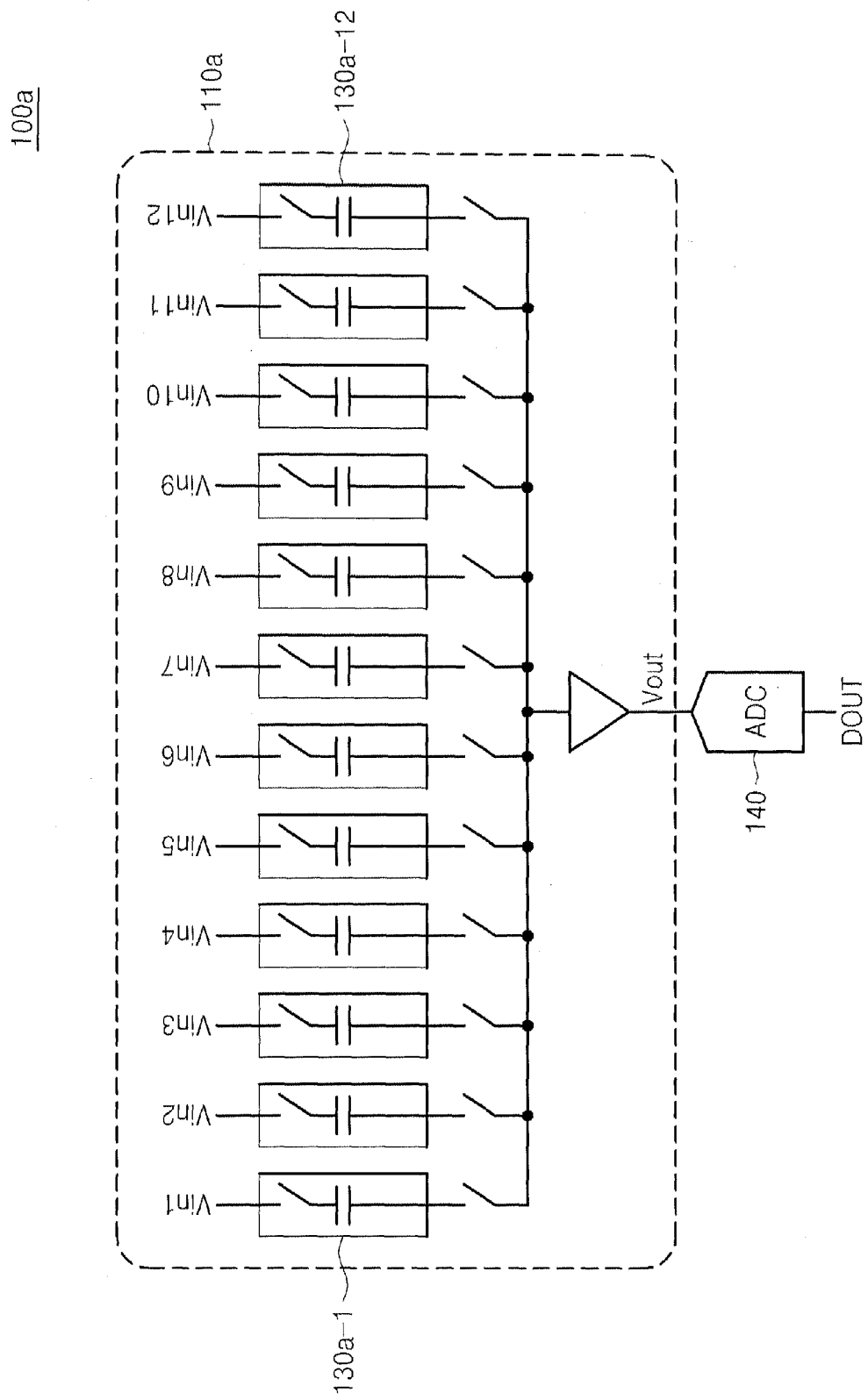
FIG. 1 is a schematic circuit diagram of a sample-and-hold circuit and an analog-to-digital converter (ADC) according to some embodiments of the inventive concepts.

The inventive concepts now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 2:
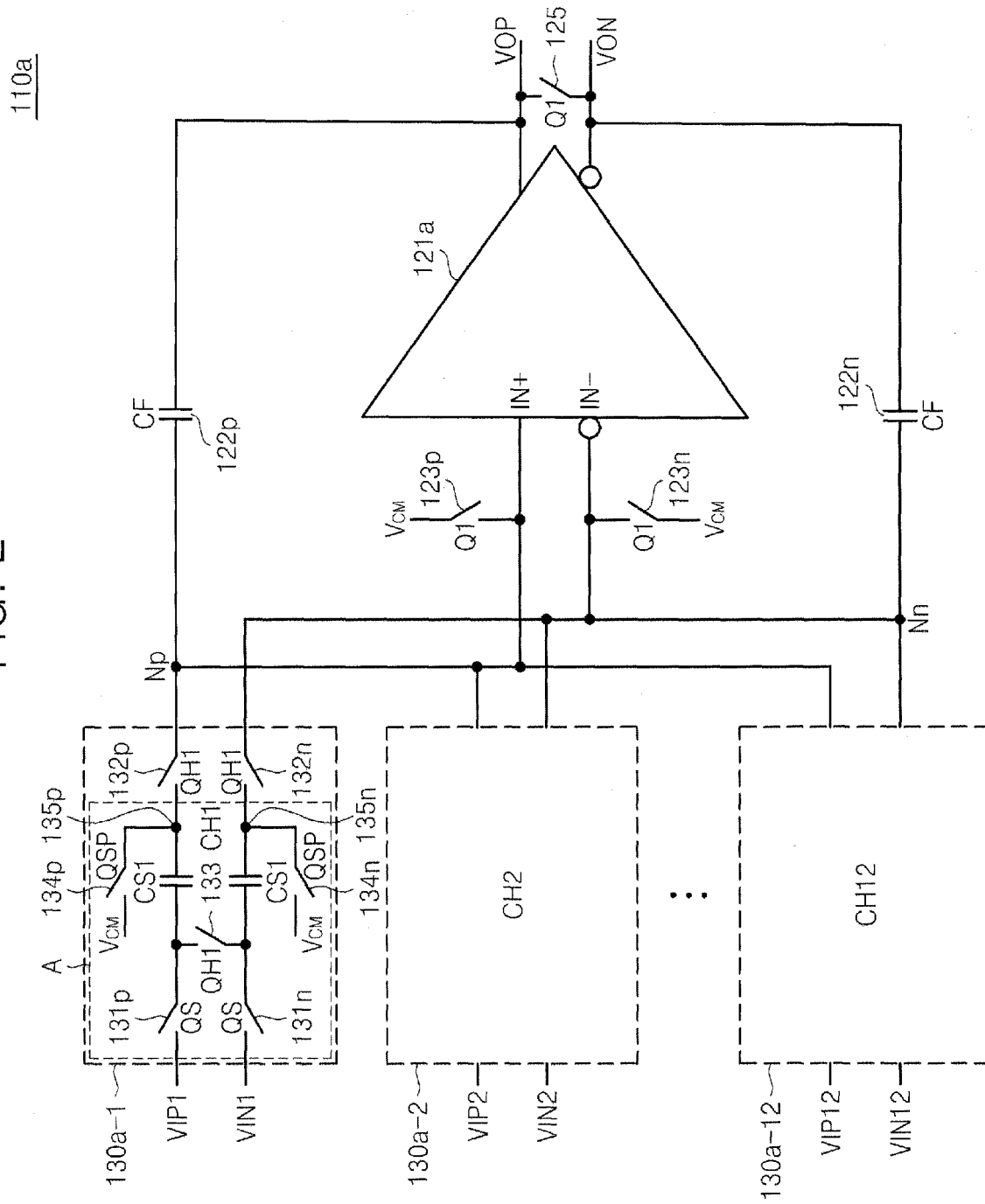
FIG. 2 is a detailed circuit diagram of the sample-and-hold circuit illustrated in FIG. 1.

FIG. 1 is a schematic circuit diagram of a sample-and-hold circuit 110a and an analog-to-digital converter (ADC) 140 according to some embodiments of the inventive concepts. FIG. 2 is a detailed circuit diagram of the sample-and-hold circuit 110a illustrated in FIG. 1. For convenience' sake in the description, 12 channels are illustrated in the current embodiments. However, the inventive concept is not restricted to the current embodiments. The number of channels may vary with embodiments.

Referring to FIG. 1, A Analog Front End(AFE) 100a receives a plurality of sensing pulse signals output from a plurality of sensing channels. The AFE 100a includes a sample-and-hold circuit 110a and an ADC 140 to perform a sample-and-hold operation and analog-to-digital converting on the plurality of pulse signals and output a plurality of digital signals. The sample-and-hold circuit 110a is connected between the plurality of channels CH1 through CH12 and an input terminal of the ADC 140 to perform a sampling operation and a holding operation on an analog signal applied through each channel and to input the sampled and held analog signal to the ADC 140.

The sample-and-hold circuit 110a includes as many input ports 130a-1 through 130a-12 as the number of channels and a single operational amplifier 121a in order to perform the sampling operation and the holding operation on an analog signal.

Each of the input ports 130a-1 through 130a-12 includes a sampling capacitor block A and a controller, the controller may be embodied as one or more hold switches. For example, the controller may be a plurality of hold switches, including hold switches 132p, 132n and 133. However, the inventive concepts are not restricted to the current embodiments, the ADC 140 may be independently implemented.

The operational amplifier 121a may be differential amplifier or a fully differential amplifier. In detail, the differential amplifier provides an output proportional to a difference between an inverted input signal and a non-inverted input signal. It may reduce noise caused by the change in a power supply voltage or temperature. The fully differential amplifier provides an inverted output signal and a non-inverted output signal. A difference between the two output signals is proportional to a difference between two input signals. For convenience' sake in the description, the fully differential amplifier is illustrated in the drawings, but the inventive concepts are not restricted thereto. The type of the operational amplifier 121a may vary with the embodiments.

The sample-and-hold circuit 110a includes at least one feedback capacitor (122p, 122n), the operational amplifier 121a, as many sampling capacitor block A as the number of channels, as many controllers as the number of channels, and as many reset units (123p, 123n, 125) as the number of input terminals (IN+, IN−) of the operational amplifier 121a.

Each sampling capacitor block A includes a first sampling switch (131p, 131n) receiving an analog signal Vin1 through the channel in response to a first sampling control signal QS, a sampling capacitor CS1 charged to hold a voltage of the analog signal Vin1, and a second sampling switch (134p, 134n) connected between an output terminal (135p, 135n) of the sampling capacitor block A and a reference voltage source VCM in response to a second sampling control signal QSP.

The controller applies the signal that has been held to the operational amplifier 121a in response to a hold control signal QH, which is sequentially applied to the plurality of channels. The controller switches the hold switch (132p, 132n) in response to the hold control signal QH, so that the held signal is output to a first node (Np, Nn).

The controller may be implemented by at least one switch. The controller may include the first hold switch (132p, 132n) connected between the output terminal (135p, 135n) of the sampling capacitor block A and the first node (Np, Nn) and a second hold switch 133 connected in series between differential input terminals of the channel. The first and second hold switches (132p, 132n) and 133 operate in response to the hold control signal QH.

The reset unit (123p, 123n, 125) is connected between the reference voltage source VCM and the input terminal (IN+, IN−) of the operational amplifier 121a. The reset unit (123p, 123n, 125) resets the operational amplifier 121a for the next holding operation while the operational amplifier 121a is not performing the holding operation.

As illustrated in FIGS. 1 and 2, when the operational amplifier 121a has the single input terminal (IN+, IN−), the controller includes the hold switch (132p, 132n) connected between the end (135p, 135n) of a plate of the sampling capacitor block A and the first node (Np, Nn). The sample-and-hold circuit 110a switches the hold switch (132p, 132n) in response to the hold control signal QH, which is sequentially applied to the plurality of channels, so that one of signals that have been held at each channel is sequentially output to the first node (Np, Nn).

Figure 3:
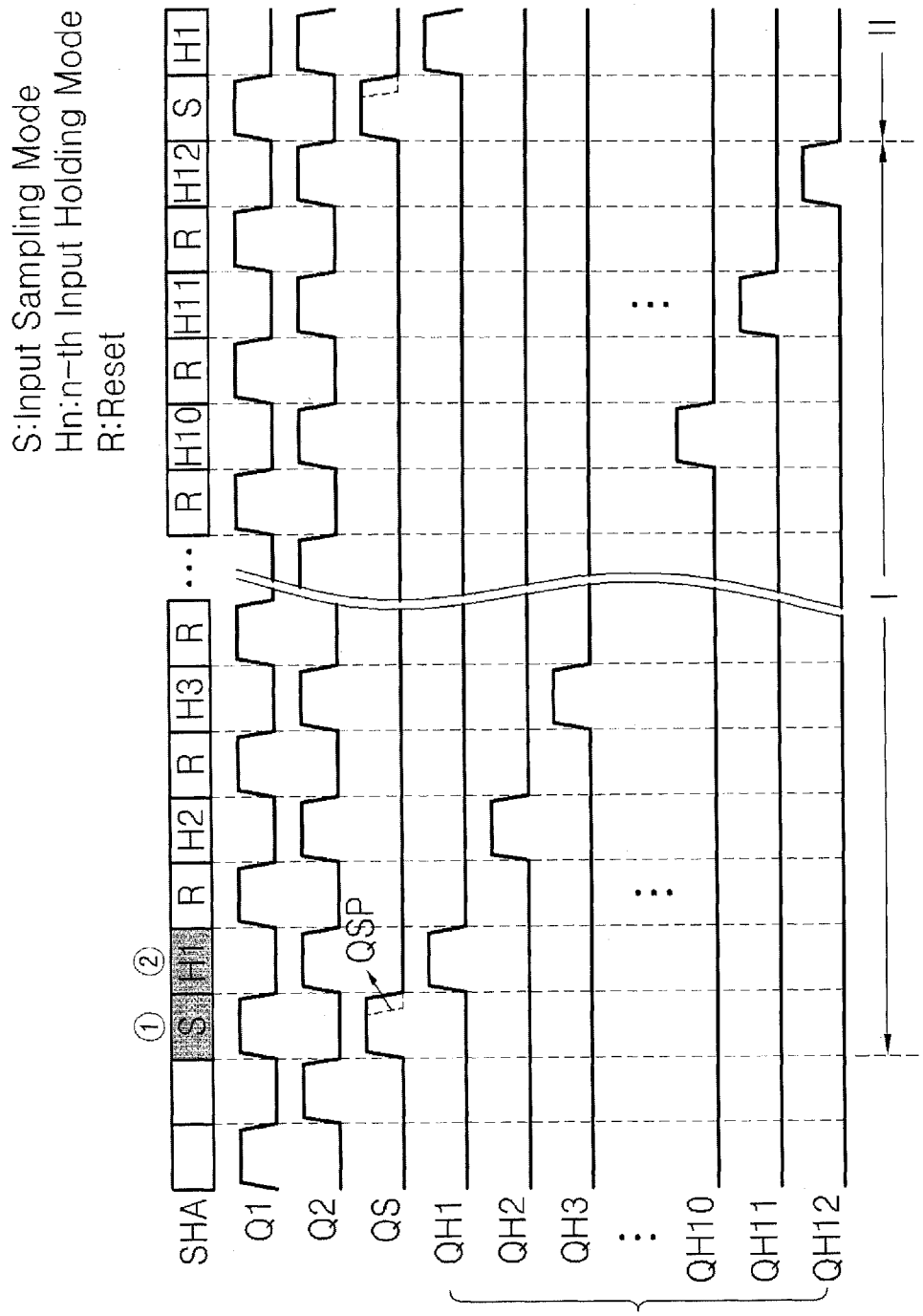
FIG. 3 is a timing chart showing the operation of the sample-and-hold circuit illustrated in FIG. 2.
Figure 4:
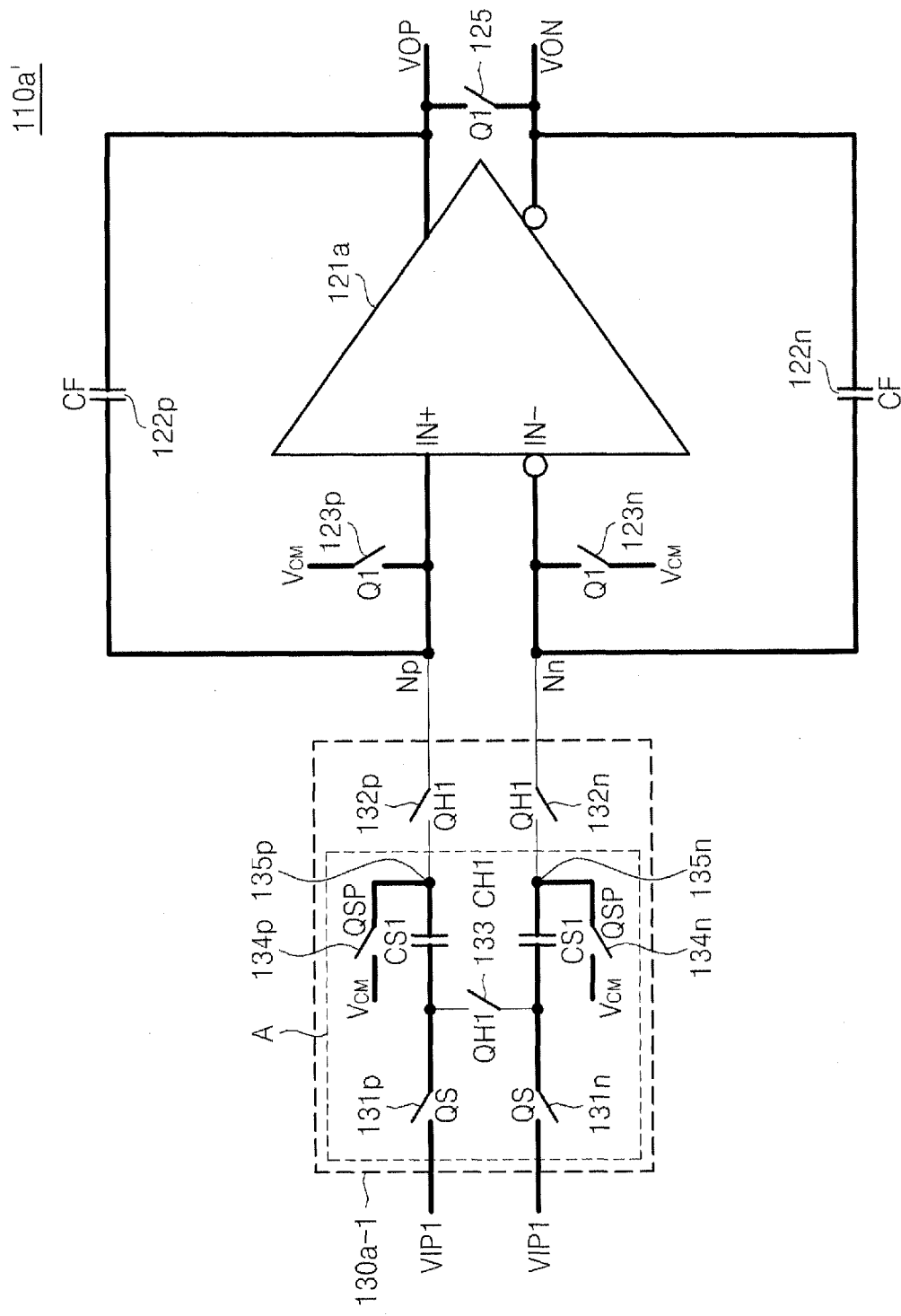
FIG. 4 is a schematic circuit diagram of a sample-and-hold circuit in a sampling mode illustrated in FIG. 3.
Figure 5:
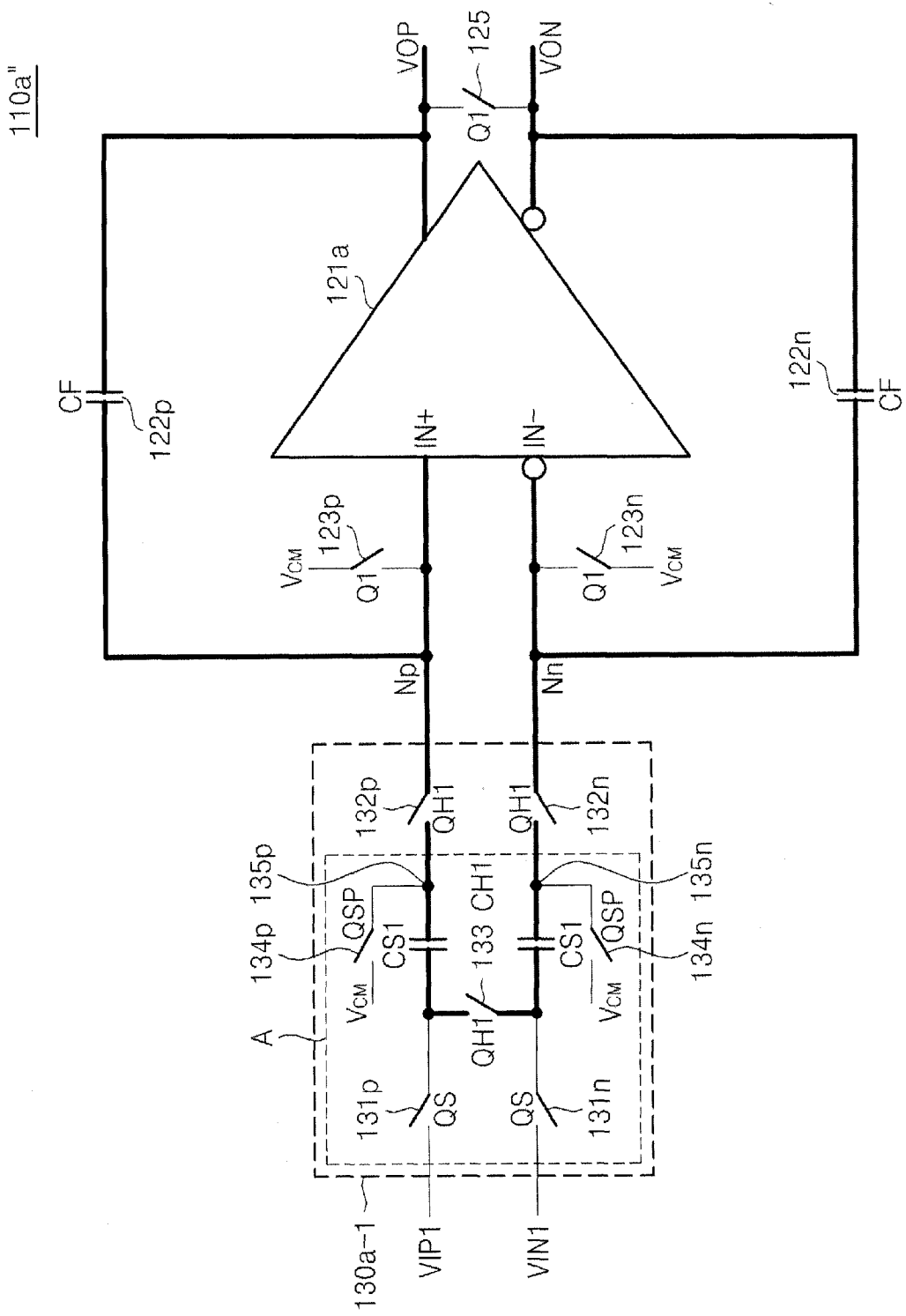
FIG. 5 is a schematic circuit diagram of the sample-and-hold circuit in a holding mode illustrated in FIG. 3.

FIG. 3 is a timing chart showing the operation of the sample-and-hold circuit 110a illustrated in FIG. 2. FIG. 4 is a schematic circuit diagram of a sample-and-hold circuit 110a' in a sampling mode illustrated in FIG. 3. FIG. 5 is a schematic circuit diagram of a sample-and-hold circuit 110a" in a holding mode illustrated in FIG. 3.

Referring to FIG. 3, a signal Q1 and a signal Q2 are non-overlapped clock signals in a switched capacitor structure. While one of the signals Q1 and Q2 is a clock signal used in the sampling mode, the other one of them is a clock signal used in the holding mode. The signals Q1 and Q2 do not overlap each other, so that the sampling mode and the holding mode do not occur at the same time. For instance, the sample-and-hold circuit 110a operates in the sampling mode when the signals Q1 is enabled (e.g., high) and operates in the holding mode when the signal Q2 is enabled (e.g., high).

Referring to FIGS. 3 and 4, when the signal Q1 is enabled (e.g., high) and the signal Q2 is disabled (e.g., low) in the sampling mode (①) of the sample-and-hold circuit 110a', the sampling capacitor block A and the operational amplifier 121a are disconnected from each other by the hold switches 132p and 132n, so that they operate independently from each other.

In other words, the sampling capacitor block A turns on the first sampling switch (131p, 131n) and the second sampling switch (134p, 134n) in response to the first sampling control signal QS and the second sampling control signal QSP, so that a signal input through the channel is stored in the sampling capacitor CS1. At this time, the second sampling switch (134p, 134n) applies a reference voltage VCM to an upper plate of the sampling capacitor CS1 as a fixed voltage in the sampling mode, so that charges are efficiently stored in a bottom plate of the sampling capacitor CS1. The sampling capacitor block A opens the second sampling switch (134p, 134n) prior to the first sampling switch (131p, 131n), thereby preventing charge injection that may occur in the sampling capacitor CS1 when the sampling mode is followed by the holding mode.

Meanwhile, the signal Q1 is applied to the reset unit in the operational amplifier 121a, and a feedback path is formed, so that an output signal (VOP, VON) of the operational amplifier 121a is fed back to the input terminal (IN+, IN−) via the feedback capacitor (122p, 122n). At this time, the input terminal (IN+, IN−) is connected to the reset unit and is reset by the reference voltage VCM. In other words, every time when the signal Q1 in response to which the sample-and-hold circuit 110a' is not in the holding mode is applied to the operational amplifier 121a, the operational amplifier 121a resets an output terminal. When the signal Q2 is applied to the operational amplifier 121a, the operational amplifier 121a eliminates residual charges remaining from a previous holding mode from the output terminal. As a result, a memory effect caused by a parasitic capacitor at the input terminal of the operational amplifier 121a and a finite open loop gain of the operational amplifier 121a is prevented.

Referring to FIGS. 3 and 5, when the signal Q1 is disabled (e.g., low) and the signal Q2 is enabled (e.g., high) in the holding mode (②) of the sample-and-hold circuit 110a, the sampling capacitor block A is disconnected from a channel input (VIP1, VIN1) and the hold switch (132p, 132n) is turned on, connecting the operational amplifier 121a with the sampling capacitor block A.

The first sampling switch (131p, 131n) is turned off in response to the first sampling control signal QS, so that the sampling capacitor block A is disconnected from the channel input (VIP1, VIN1). The second sampling switch (134p, 134n) is turned off in response to the second sampling control signal QSP, so that the sampling capacitor block A is disconnected from the reference voltage VCM. As a result, sampled charges are stored in the sampling capacitor CS1. The first hold switch (132p, 132n) of the controller is turned on in response to a hold control signal QH1, so that the sampling capacitor block A is connected to the first node (Np, Nn). In addition, bottom plates of the sampling capacitor CS1 are connected with each other through the second hold switch 133 for the redistribution of charge. Since the signal Q1 is not applied to the reset unit in the holding mode, output terminals VOP and VON of the operational amplifier 121a are disconnected from each other. As a result, charge stored in the sampling capacitor CS1 is output as an output signal in proportion to a ratio of the sampling capacitor CS1 and a feedback capacitor CF. In other words, an output of the sample-and-hold circuit 110a for the first channel is defined as Equation 1:

$$VO = \frac{CS1}{CF} VI_1, \tag{1}$$

where the output signal is VO=VOP−VON and an input signal is VI1=VIP1−VIN1.

Consequently, input signals (VIP1, VIN1) through (VIP12, VIN12) that have been sampled at the respective channels at the same time in response to the signal QS are sequentially transmitted to a node at the back of the first hold switch (132p, 132n). In this case, an error that may occur in an open loop of the operational amplifier 121a because the single operational amplifier 121a is shared by the plurality of the channels CH1 through CH12 is reset every time the signal Q1 is applied to the operational amplifier 121a, so that residual charges remaining in the input ports 130a-1 through 130a-12 are eliminated. Accordingly, even though the number of channels increases, the number of operational amplifiers consuming a lot of power is reduced, and therefore, the power consumption and chip area of the sample-and-hold circuit 110a is reduced.

Figure 6:
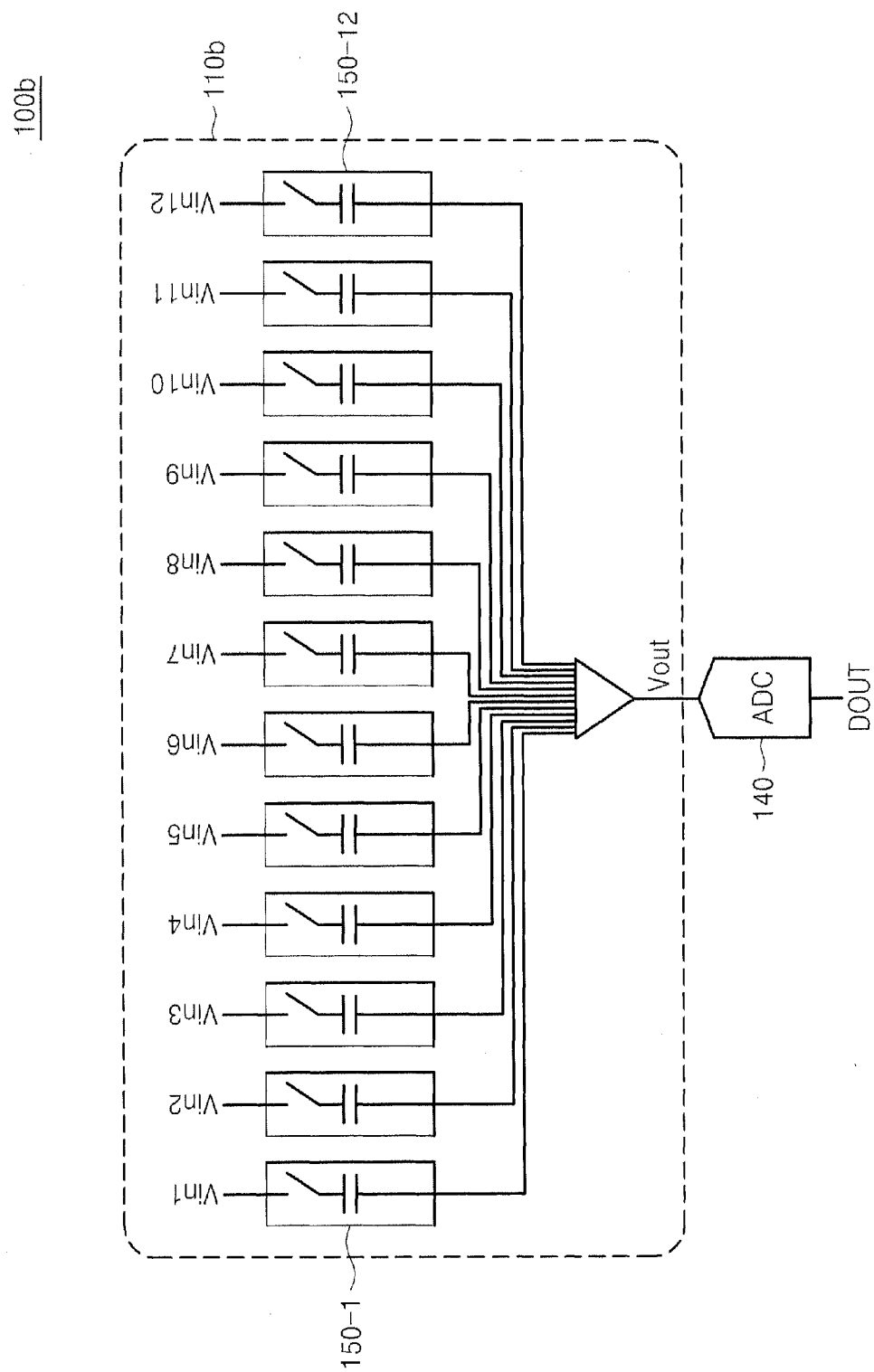
FIG. 6 is a schematic circuit diagram of a sample-and-hold circuit according to other embodiments of the inventive concepts.
Figure 7:
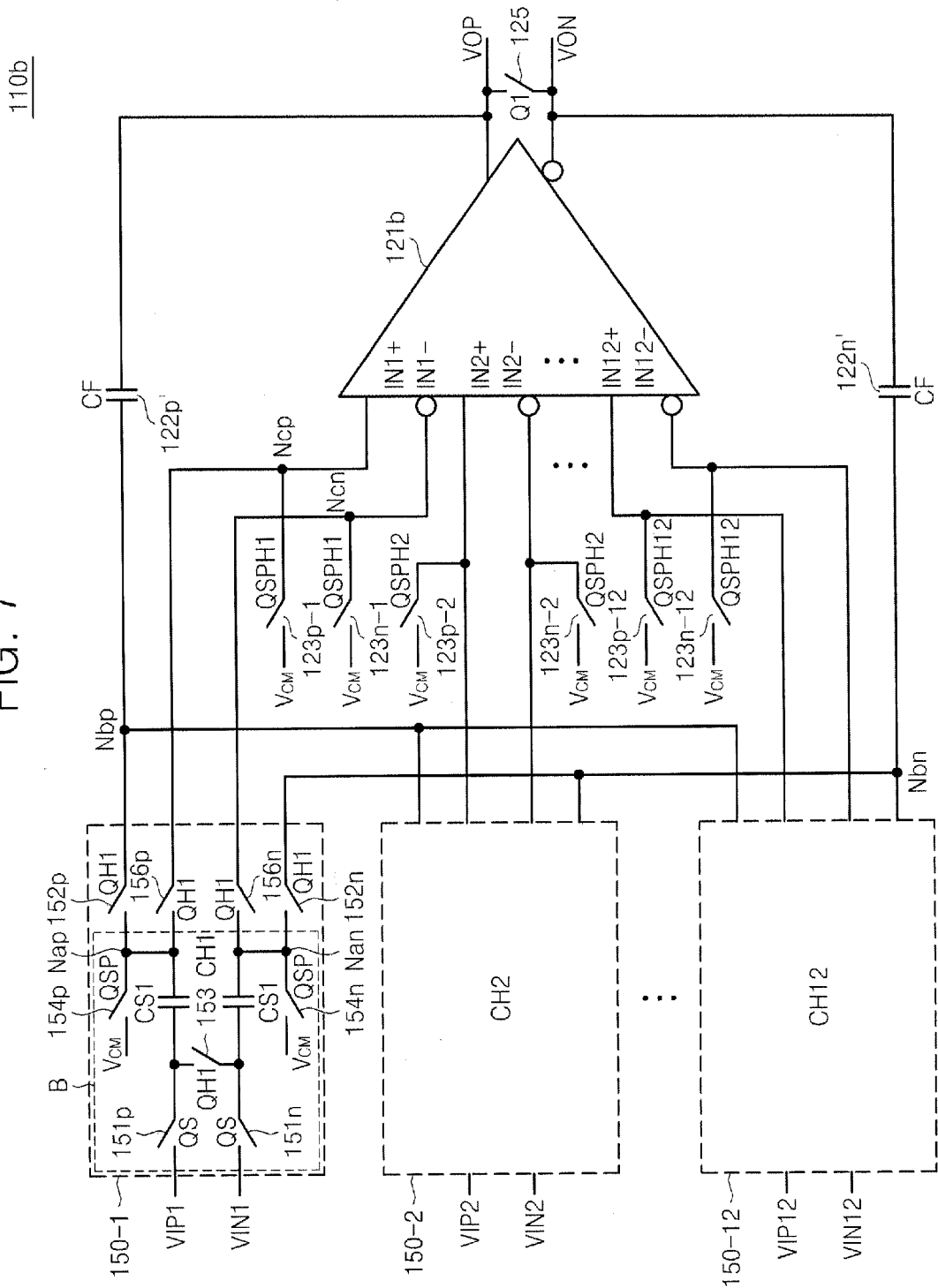
FIG. 7 is a detailed circuit diagram of the sample-and-hold circuit illustrated in FIG. 6.
Figure 8:
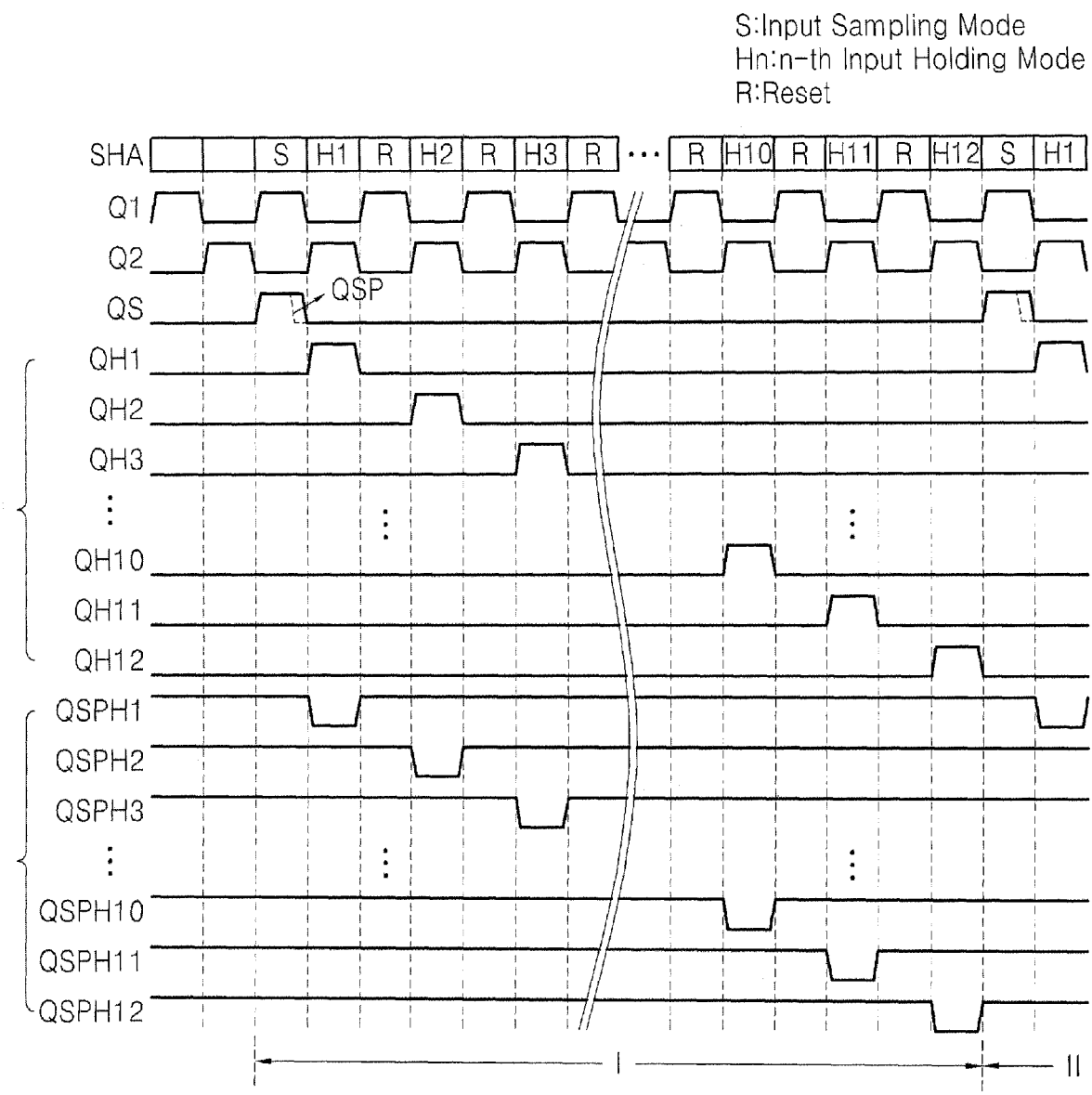
FIG. 8 is a timing chart showing the operation of the sample-and-hold circuit illustrated in FIG. 7.

FIG. 6 is a schematic circuit diagram of a sample-and-hold circuit 110b according to other embodiments of the inventive concepts. FIG. 7 is is a detailed circuit diagram of the sample-and-hold circuit 100b illustrated in FIG. 6. FIG. 8 is a timing chart showing the operation of the sample-and-hold circuit 110b illustrated in FIG. 7.

For convenience' sake in the description, 12 channels are illustrated in the current embodiments. However, the inventive concepts are not restricted to the current embodiments. The number of channels may vary with embodiments. In addition, differences from the embodiments illustrated in FIGS. 1 through 3 will be mainly described to avoid redundancy.

Referring to FIGS. 6 and 7, A Analog Front End(AFE) 100b includes a sample-and-hold circuit 110b and an ADC 140 to perform a sample-and-hold operation and analog-to-digital converting on the plurality of pulse signals and output a plurality of digital signals. The sample-and-hold circuit 110b includes as many input ports 150a-1 through 150a-12 as the number of channels and a single operational amplifier 121b in order to perform the sampling operation and the holding operation on an analog signal.

The sample-and-hold circuit 110b includes at least one feedback capacitor CF (122p', 122n'), the operational amplifier 121b, as many sampling capacitor blocks B as the number of channels, as many controllers as the number of channels, and as many reset units as the number of input terminals (IN1+, IN1−) through (N12+, N12−) of the operational amplifier 121b. Unlike the operational amplifier 121a illustrated in FIGS. 1 and 2, the operational amplifier 121b illustrated in FIGS. 6 and 7 includes as many input terminals as the number of channels.

Each sampling capacitor block B has the same structure as the sampling capacitor block A illustrated in FIGS. 1 and 2. However, the controller includes a third hold switch (152p, 152n) in addition to a first hold switch (156p, 156n) and a second hold switch 153.

When the hold control signal QH1 is applied to the sample-and-hold circuit Hob, the first hold switch (156p, 156n) is connected between an output terminal (Nap, Nan) of the sampling capacitor block B and a first node (Ncp, Ncn) and the second hold switch 153 is connected to a bottom plate of the sampling capacitor CS1 for the redistribution of charge in the controller illustrated in FIGS. 6 and 7 as in the controller illustrated in FIGS. 1 and 2. However, since the operational amplifier 121b has as many input terminals as the number of channels, the third hold switch (152p, 152n) is connected in series between a channel input terminal, i.e., a second node (Nap, Nan) and the feedback capacitor (122p', 122n'), so that one channel input terminal and one input terminal of the operational amplifier 121b are connected to the feedback capacitor CF to perform the holding operation. The reset units (123p-k, 123n-k, 125) respectively include as many reset switches (123p-1, 123n-1) through (123p-12, 123n-12) as the number of the input terminals (IN1+, IN1−) through (IN12+, IN12−) of the operational amplifier 121b, which are connected between the reference voltage source VCM and the input terminals (IN1+, IN1−) through (IN12+, IN12−), respectively, of the operational amplifier 121b, so as to reset an output terminal and non-used input terminals of the operational amplifier 121b every time when the signal Q1 in response to which the operational amplifier 121b does not operate in the holding mode is applied to the sample-and-hold circuit 110b.

Referring to FIG. 8, the sample-and-hold circuit 110b operates in the sampling mode for all of first through twelfth channels in response to the signal QS. In response to the signal Q2, the sample-and-hold circuit 110b sequentially transmits the first through twelfth channels' input signals (VIP1, VIN1) through (VIP12, VIN12) to a node at the back of the first hold switch (156p, 156n). At this time, a group reset control signal QSPH is used to allow a plurality of channels to share the single operational amplifier 121b having a plurality of input terminals. In other words, since the channels are respectively connected to the input terminals of the operational amplifier 121b, only one of group reset control signals QSPH1 through QSPH12 is disabled in the holding operation of one channel and the others of them are enabled to reset the non-used input terminals of the operational amplifier 121b so that the operational amplifier 121b outputs only one of a plurality of channel inputs in the holding operation of the one channel Accordingly, even though the number of channels increases, the number of operational amplifiers consuming a lot of power is reduced, so that the power consumption and the chip area of the sample-and-hold circuit 110b are reduced.

Figure 9:
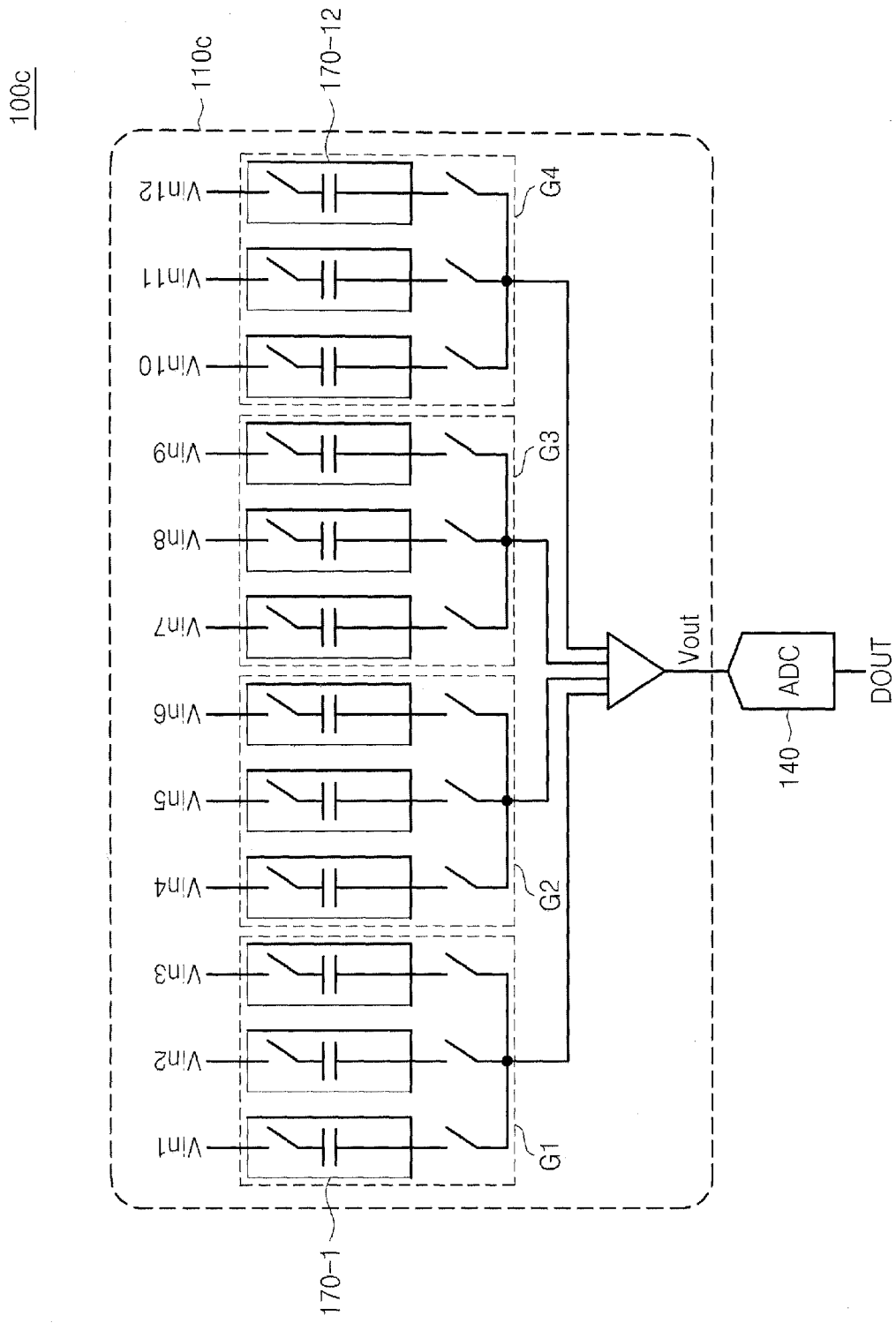
FIG. 9 is a schematic circuit diagram of a sample-and-hold circuit according to further embodiments of the inventive concepts.
Figure 10:
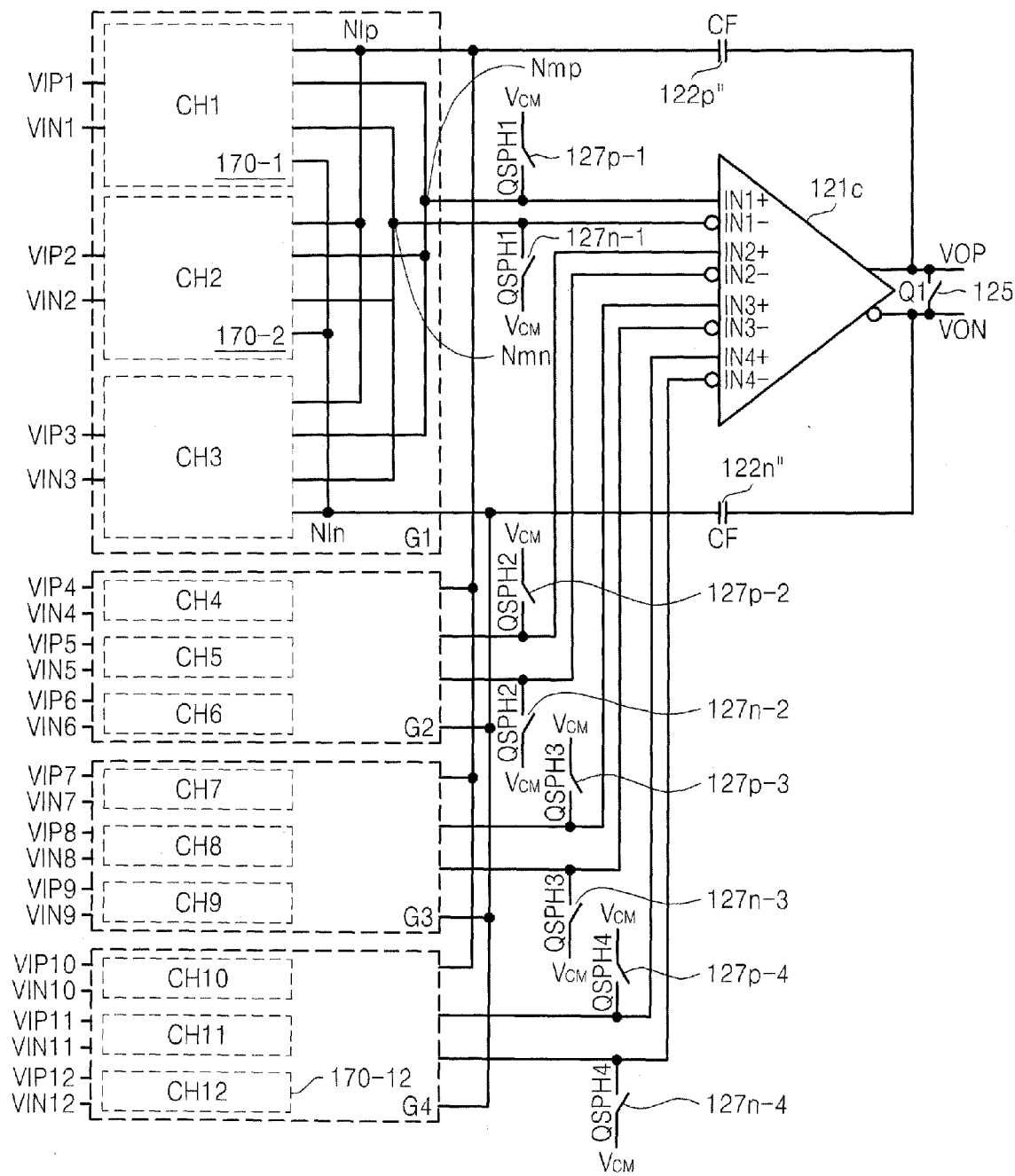
FIG. 10 is is a detailed circuit diagram of the sample-and-hold circuit illustrated in FIG. 9.
Figure 11:
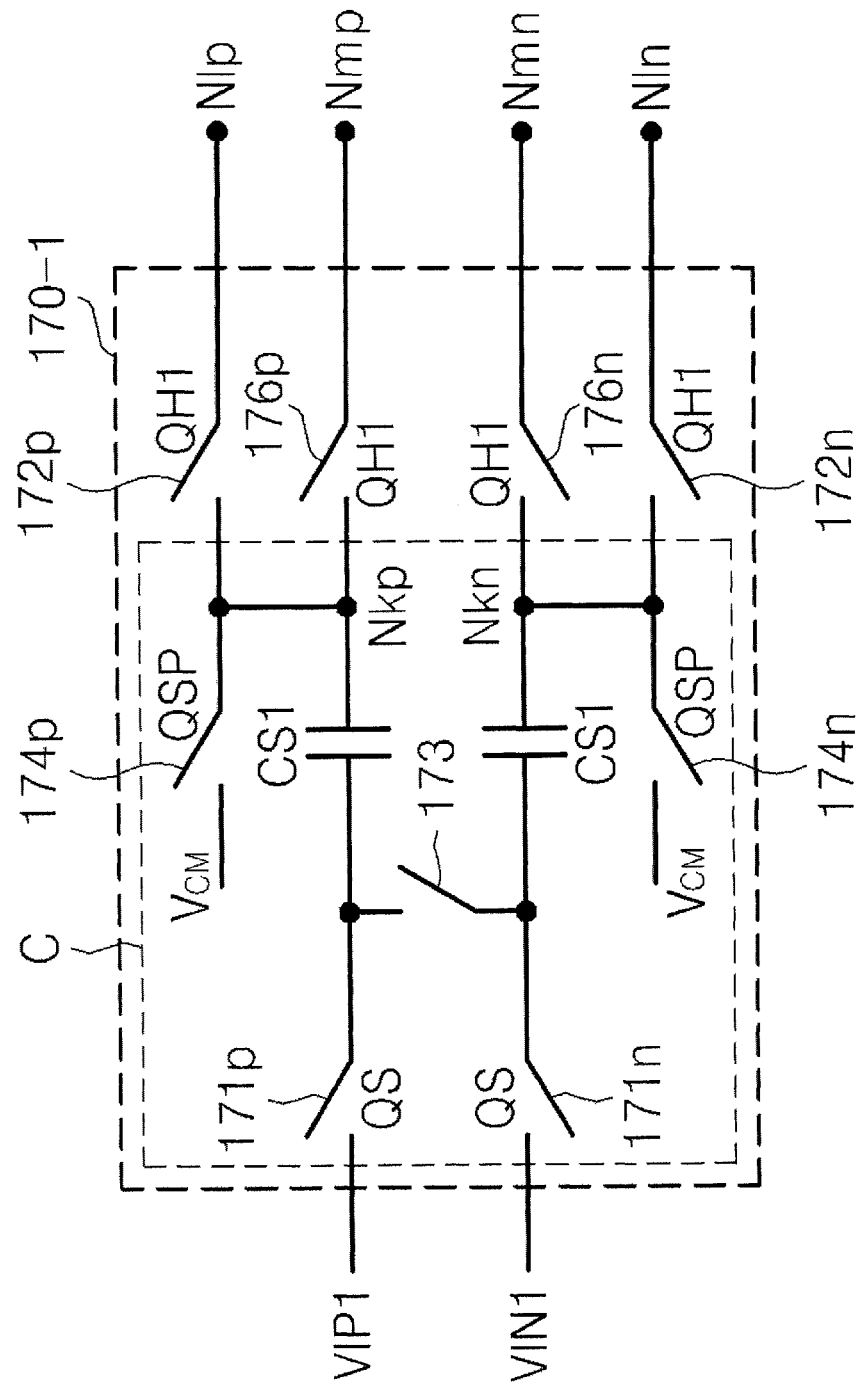
FIG. 11 is a detailed circuit diagram of one of channel input ports illustrated in FIG. 10.
Figure 12:
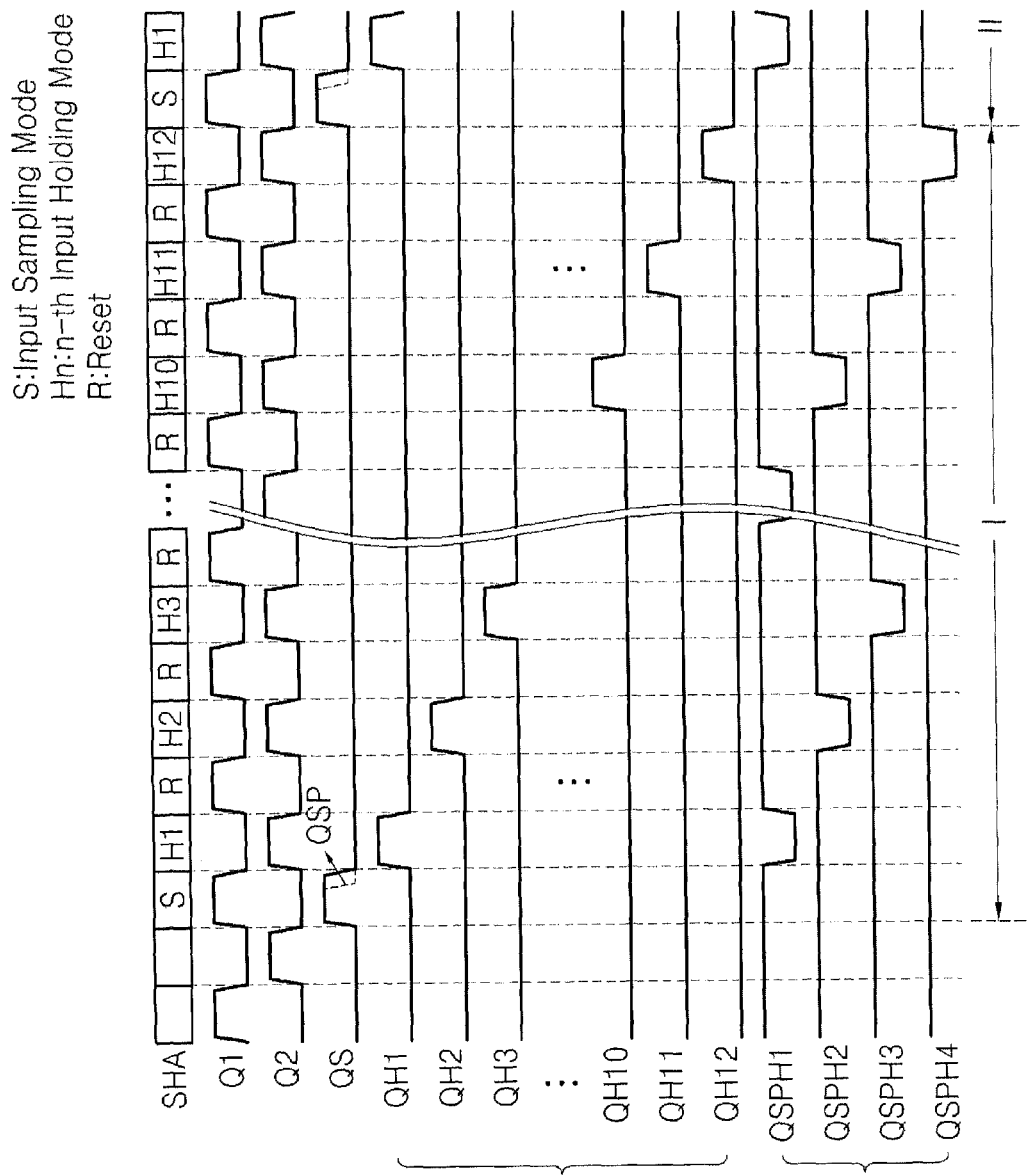
FIG. 12 is a timing chart showing the operation of the sample-and-hold circuit illustrated in FIG. 10.

FIG. 9 is a schematic circuit diagram of a sample-and-hold circuit 110c and the ADC 140 according to further embodiments of the inventive concepts. FIG. 10 is is a detailed circuit diagram of the sample-and-hold circuit 110c illustrated in FIG. 9. FIG. 11 is a detailed circuit diagram of a channel input port 170-1 among channel input ports 170-1 through 170-12 illustrated in FIG. 10. FIG. 12 is a timing chart showing the operation of the sample-and-hold circuit 110c illustrated in FIG. 10.

For convenience' sake in the description, 12 channels are illustrated in the current embodiments. However, the inventive concepts are not restricted to the current embodiments. The number of channels may vary with embodiments. In addition, differences from the embodiments illustrated in FIGS. 1 through 3 will be mainly described to avoid redundancy.

Referring to FIGS. 9 and 10, a Analog Front End(AFE) 100c includes a sample-and-hold circuit 110c and an ADC 140 to perform a sample-and-hold operation and analog-to-digital converting on the plurality of pulse signals and output a plurality of digital signals. The sample-and-hold circuit 110c includes as many input ports 170-1 through 170-12 as the number of channels and a single operational amplifier 121c in order to perform the sampling operation and the holding operation on an analog signal.

The sample-and-hold circuit 110c includes at least one feedback capacitor CF (122p", 122n"), the operational amplifier 121c, as many sampling capacitor blocks C as the number of channels, as many controllers as the number of channels, and as many reset units (127p-1 through 127p4, 127n-1 through 127n-4, and 125) as the number of input terminals (IN1+, IN1−) through (IN4+, IN4−) of the operational amplifier 121c. Unlike the operational amplifier 121a illustrated in FIGS. 1 and 2, the operational amplifier 121c illustrated in FIGS. 9 and 10 includes as many input terminals as the number of channel groups. When the number of channels increases, at least two channels are grouped while the structure of the operational amplifier 121b illustrated in FIG. 6 is being used, thereby reducing the number of input terminals of the operational amplifier 121c. For convenience' sake in the description, three channels are grouped into a single channel group, but the number of channels in each channel group may changed.

Referring to FIG. 11, each sampling capacitor block C has the same structure as the sampling capacitor block A illustrated in FIGS. 1 and 2. However, the controller includes a third hold switch (172p, 172n) in addition to a first hold switch (176p, 176n) and a second hold switch 173.

When the hold control signal QH1 is applied to the sample-and-hold circuit 110c, the first hold switch (176p, 176n) is connected between an output terminal (Nkp, Nkn) of the sampling capacitor block C and a first node (Nmp, Nmn) and the second hold switch 173 is connected to a bottom plate of the sampling capacitor CS1 for the redistribution of charge in the controller illustrated in FIGS. 9 and 10 as in the controller illustrated in FIGS. 1 and 2. However, since the operational amplifier 121c has as many input terminals as the number of channel groups, the third hold switch (172p, 172n) is connected in series between a channel input terminal, i.e., a second node (175p, 175n) and the feedback capacitor (122p", 122n"), so that one channel group input terminal and one input terminal of the operational amplifier 121c are connected to the feedback capacitor CF to perform the holding operation. The reset units (127p-k, 127n-k, 125) respectively include as many reset switches (127p-1, 127n-1) through (127p-4, 127n-4) as the number of the input terminals (IN1+, IN1−) through (IN4+, IN4−) of the operational amplifier 121c, which are connected between the reference voltage source VCM and the input terminals (IN1+, IN1−) through (IN4+, IN4−), respectively, of the operational amplifier 121c, so as to reset an output terminal and non-used input terminals of the operational amplifier 121c every time when the signal Q1 in response to which the operational amplifier 121c does not operate in the holding mode is applied to the sample-and-hold circuit 110c.

Referring to FIG. 12, the sample-and-hold circuit 110c operates in the sampling mode for all of first through twelfth channels in response to the signal QS. In response to the signal Q2, the sample-and-hold circuit 110c sequentially transmits the first through twelfth channels' input signals (VIP1, VIN1) through (VIP12, VIN12) to a node at the back of the first hold switch (176p, 176n). At this time, a group reset control signal QSPH is used to allow a plurality of channel groups to share the single operational amplifier 121c having a plurality of input terminals. In other words, since the channel groups are respectively connected to the input terminals of the operational amplifier 121c, only one of group reset control signals QSPH1 through QSPH4 is disabled in the holding operation of a selected channel and the others of them are enabled to reset the non-used input terminals of the operational amplifier 121c so that the operational amplifier 121c outputs an input of a channel group including the selected channel among a plurality of channel group inputs in the holding operation of the selected channel Accordingly, even though the number of channels increases, the number of operational amplifiers consuming a lot of power is reduced, so that the power consumption and the chip area of the sample-and-hold circuit 110c are reduced.

Figure 13:
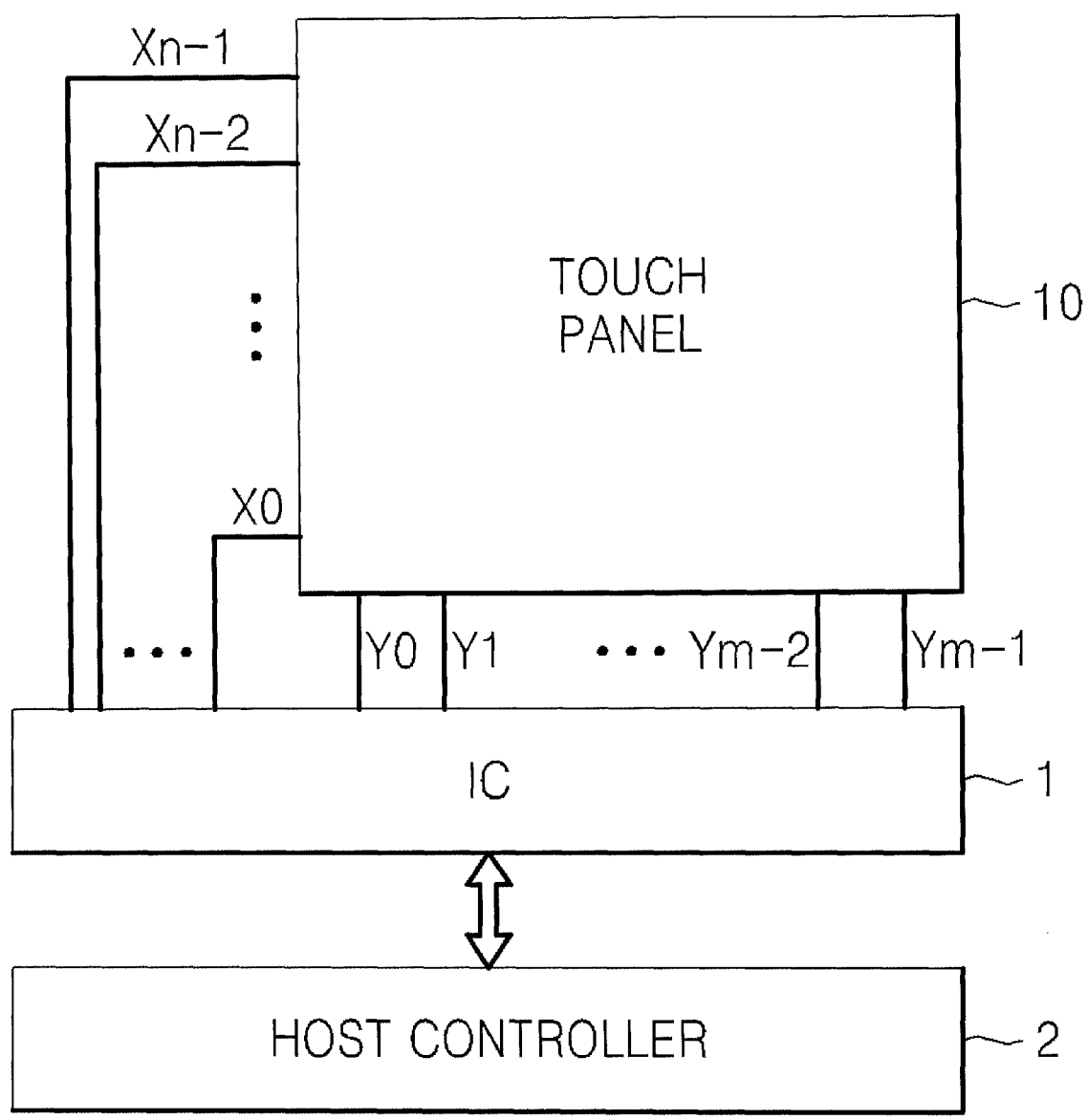
FIG. 13 is a block diagram of a touch screen device.
Figure 14:
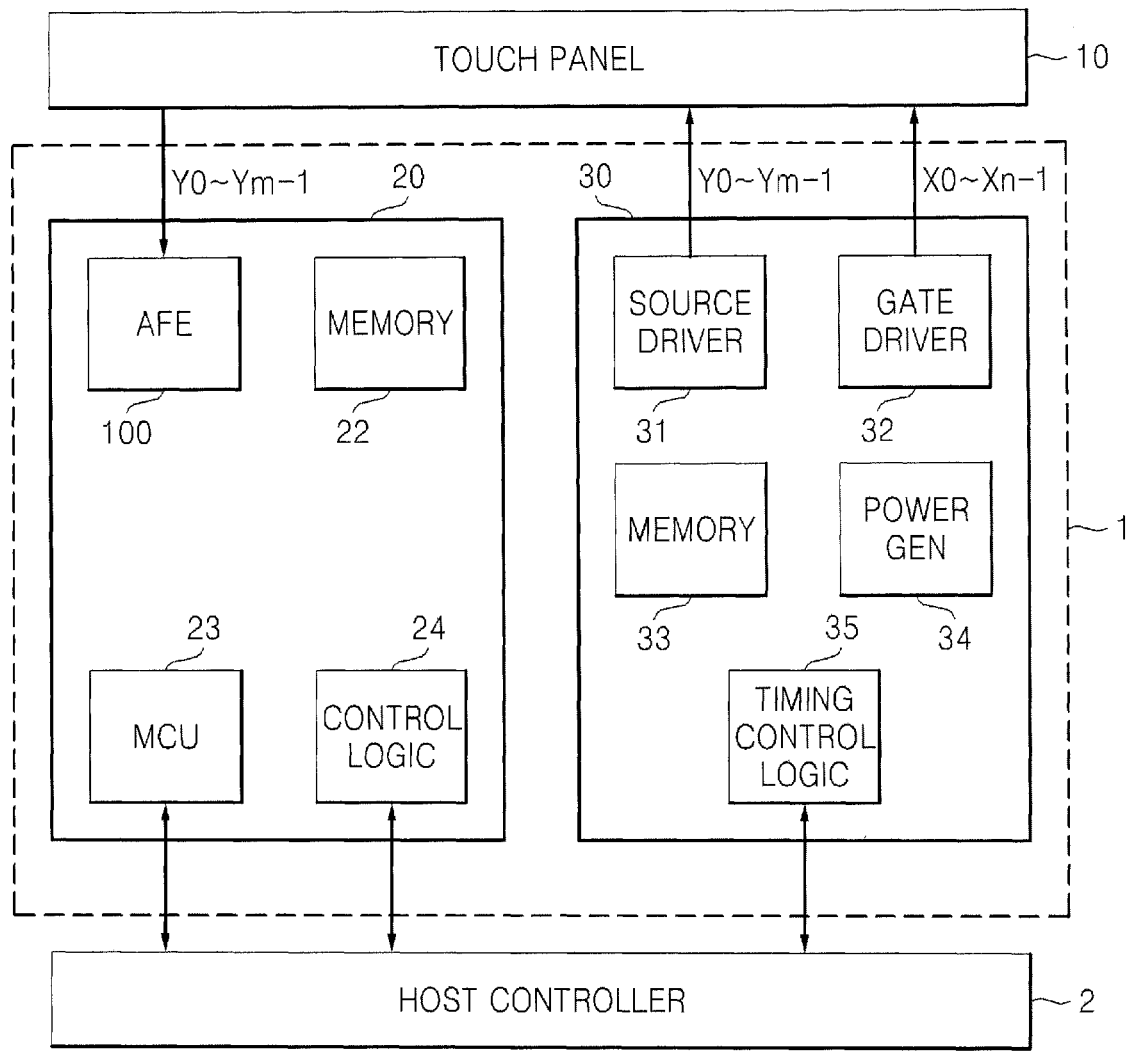
FIG. 14 is a detailed block diagram of an integrated circuit illustrated in FIG. 13.

FIG. 13 is a block diagram of a touch screen device. FIG. 14 is a detailed block diagram of an integrated circuit (IC) 1 illustrated in FIG. 13.

Referring to FIG. 13, the touch screen device includes a touch panel 10, the IC 1, and a host controller 2.

The touch panel 10 is a sensor array including a plurality of sensor units. The host controller 2 may communicate with the IC 1.

Referring to FIGS. 13 and 14, the IC 1 includes a touch controller 20 and a display driver 30.

The touch controller 20 includes an analog front end (AFE) 100, a memory 22, a micro control unit (MCU) 23, and a control logic 24.

The AFE 100 receives a plurality of sensing pulse signals output from the plurality of sensor units included in the touch panel 10. The AFE 100 includes a sample-and-hold circuit 110 and an ADC 140 to perform a sample-and-hold operation and analog-to-digital converting on the plurality of pulse signals and output a plurality of digital signals.

The memory 22 stores a digital signal output from the AFE 100 or processed by the MCU 23.

The MCU 23 and the control logic 24 may communicate with the host controller 2.

The control logic 24 may generate control signals for controlling a touch operation.

The display driver 30 includes a source driver 31, a gate driver 32, a memory 33, a timing control logic 35, and a power generator 34.

The source driver 31 generates grayscale data for driving the touch panel 10 in response to a control signal output from the timing control logic 35.

The gate driver 32 sequentially scans gate lines X0 through Xn-1 of the touch panel 10 in response to a control signal output from the timing control logic 35.

The memory 33 stores display data.

The timing control logic 35 generates control signals for controlling the source driver 31, the gate driver 32, and the power generator 34.

The timing control logic 35 may communicate with the host controller 2.

The power generator 34 generates power in response to a control signal output from the timing control logic 35.

As described above, according to some embodiments of the inventive concepts, a sample-and-hold circuit uses only one amplifier regardless of the number of input channels, thereby minimizing a chip area and power consumption. In addition, when the number of input channels is increased due to the change in specifications of a system, the system can be used only by only adding an input sampling network to the system. Accordingly, revision and modification can be easily made.

While the inventive concepts have been particularly shown and described with reference to example embodiments thereof, it will be understood by those of ordinary skill in the art that various changes in forms and details may be made therein without departing from the spirit and scope of the inventive concept as defined by the following claims.

What is claimed is:

1. A sample-and-hold circuit comprising:
   an operational amplifier configured to output a result signal to an analog-to-digital converter;
   a feedback capacitor connected between an input terminal and an output terminal of the operational amplifier to form a feedback path;
   a plurality of sampling capacitor blocks, each connected to one of a plurality of channels, the plurality of sampling capacitor blocks configured to sample and hold an analog signal input to each of the channels;
   a plurality of controllers, each controller connected between one of the sampling capacitor blocks and the operational amplifier, the plurality of controllers configured to switch the sampled signal so that the analog signal held in sampling capacitors of respective ones of the sampling capacitor blocks for respective channels are sequentially input to the operational amplifier; and
   a reset unit connected between a reference voltage source and the input terminal of the operational amplifier, the reset unit configured to reset the operational amplifier, if the operational amplifier does not perform a holding operation.

2. The sample-and-hold circuit of claim 1, wherein each of the sampling capacitor blocks comprises:
   a first sampling switch configured to apply the analog signal input to each of the channels in response to a first sampling control signal; and
   the sampling capacitor is configured to be charged with a voltage of the analog signal.

3. The sample-and-hold circuit of claim 2, wherein each of the sampling capacitor blocks further comprises a second sampling switch configured to electrically couple the sampling capacitor to the reference voltage source in response to a second sampling control signal.

4. The sample-and-hold circuit of claim 1, wherein the controller comprises a hold switch configured to output the held signal to the operational amplifier in response to a hold control signal, which is sequentially applied to each of the plurality of channels.

5. The sample-and-hold circuit of claim 1, wherein the reset unit is configured to reset the operational amplifier, if the operational amplifier samples the analog signal input to each of the channels and does not perform the holding operation.

6. The sample-and-hold circuit of claim 4, wherein the operational amplifier includes an input terminal connected to a first node, and
   the controller comprises a plurality of hold switches connected between a respective one of the sampling capacitor blocks and the first node, the plurality of hold switches configured to sequentially output one of the signals held, by electrically coupling the hold switches to the first node in response to the hold control signal sequentially applied to the plurality of channels.

7. The sample-and-hold circuit of claim 4, wherein the operational amplifier includes a plurality of input terminals, each input terminal respectively connected to one of a plurality of second nodes, and
   the controller comprises a plurality of hold switches connected between an output terminal of a respective one of the sampling capacitor blocks and a second node, and the controller is configured to output the signal held, by electrically coupling the hold switch to the second node in response to the hold control signal sequentially applied to the plurality of channels.

8. The sample-and-hold circuit of claim 7, wherein the reset unit is connected between the reference voltage source and the second node, the reset unit is configured to reset the output terminal of the operational amplifier and non-used input terminal of the operational amplifier, if the operational amplifier samples the analog signal input to each of the channels and does not perform the holding operation.

9. The sample-and-hold circuit of claim 1, wherein the operational amplifier is a fully differential amplifier.

10. A touch screen controller comprising:
    the sample-and-hold circuit of claim 1 electrically connected to a touch panel; and
    an analog-to-digital converter configured to convert a signal output from the sample-and-hold circuit and to output a digital signal.

11. A sample-and-hold circuit comprising:
    an operational amplifier configured to have M input terminals and one output terminal and to output a result signal to an analog-to-digital converter;
    a feedback capacitor connected between the input terminals and the output terminal of the operational amplifier to form a feedback path;
    N sampling capacitor blocks, each connected to one of N channels, the N sampling capacitor blocks each configured to sample an analog signal input to a respective one of the N channels and store the analog signal in a respective sampling capacitor therein;
    a controller connected between output terminals of at least two of the N sampling capacitor blocks and one of the input terminals of the operational amplifier, the controller configured to input each of the analog signals held at the respective sampling capacitors to a respective one of the M input terminals of the operational amplifier in response to hold control signals; and
    M reset switches, each reset switch connected between a reference voltage source and the respective input terminals of the operational amplifier, the M reset switches configured to reset the output terminal of the operational amplifier if the operational amplifier does not perform a holding operation, the M reset switches configured to reset input terminals not used in the holding operation of the operational amplifier in response to a group reset control signal,
    wherein M is less than N, and M is a natural number greater than 1.

12. The sample-and-hold circuit of claim 11, wherein each of the sampling capacitor blocks comprises:
    a first sampling switch configured to apply the analog signal input to each of the channels in response to a first sampling control signal and wherein
    the sampling capacitor is configured to be charged with a voltage of the analog signal.

13. The sample-and-hold circuit of claim 12, wherein each of the sampling capacitor blocks further comprises a second sampling switch configured to electrically couple an output terminal of the sampling capacitor and the reference voltage source.

14. The sample-and-hold circuit of claim 11, wherein the controller comprises a plurality of hold switches each connected between a respective one of the sampling capacitor blocks and one of the M input terminals of the operational amplifier, the plurality of hold switches configured to sequentially output one of the held signals in response to the hold control signal sequentially applied to the plurality of channels.

15. The sample-and-hold circuit of claim 11, wherein the operational amplifier is a fully differential amplifier.

16. A sample-and-hold circuit comprising:
   an operational amplifier having an input terminal and an output terminal electrically coupled to form a feedback loop;
   a plurality of sampling blocks configured to simultaneously sample and hold respective analog signals input from respective channels at respective sampling capacitors therein; and
   a plurality of switching units configured to sequentially couple a respective one of the plurality of sampling blocks to the operational amplifier to sequentially provide the operational amplifier with one of the analog signals held at the sampling capacitor of the respective one of the plurality of sampling blocks.

17. The sample-and-hold circuit of claim 16 further comprising:
   a reset unit configured to selectively reset the output terminal of the operational amplifier to a reference voltage.

18. The sample-and-hold circuit of claim 16, wherein the feedback loop includes a feedback capacitor and each of the sampling blocks comprise a sampling switch configured to selectively couple the sampling capacitor to the respective channel.

19. The sample-and-hold circuit of claim 18, wherein the output terminal of the operational amplifier is configured to sequentially output the respective analog signal multiplied by a ratio of a capacitance of the sampling capacitor to a capacitance of the feedback capacitor.

20. A touch screen controller comprising:
   an analog front end, including,
      an analog-to-digital converter configured to output a plurality of digital signals, and
      the sample-and-hold circuit of claim 16, the sample-and-hold circuit configured to output a signal to the analog-to-digital converter;
   a memory configured to store the plurality of digital signals; and
   a controller configured to control the analog front end.

* * * * *